United States Patent [19]

Larson

[11] Patent Number: 4,977,403

[45] Date of Patent: Dec. 11, 1990

[54] DIGITAL CORRECTION CIRCUIT FOR DATA CONVERTERS

[75] Inventor: Lawrence E. Larson, Santa Monica, Calif.

[73] Assignee: Hughes Aircraft Company, Los Angeles, Calif.

[21] Appl. No.: 226,108

[22] Filed: Jul. 29, 1988

[51] Int. Cl.[5] .................... H03M 3/02; H03M 1/06
[52] U.S. Cl. ................................ 341/143; 341/118
[58] Field of Search ............... 341/118, 143, 144, 155

[56] References Cited

U.S. PATENT DOCUMENTS

| | | | |
|---|---|---|---|
| 4,021,799 | 5/1977 | Hinoshita et al. | 341/143 |
| 4,059,800 | 11/1977 | Jones, Jr. | 341/143 |
| 4,308,524 | 12/1981 | Harrison et al. | 341/143 |
| 4,549,305 | 10/1985 | Fushikida | 341/143 |

OTHER PUBLICATIONS

Candy, "A Use of Limit Cycle Oscillations to Obtain Robust Analog-to-Digital Converters", IEE Transactions on Communications, vol. COM-22, No. 3, Mar. 1974, pp. 298-305.

Primary Examiner—William M. Shoop, Jr.
Assistant Examiner—Marc S. Hoff
Attorney, Agent, or Firm—Paul M. Coble; Wanda K. Denson-Low

[57] ABSTRACT

A digital correction circuit for use in signal converters is disclosed. The invention includes a subtractor (32) for subtracting a digital correction signal from an input signal, a digital filter (34) for filtering the output of the subtractor to provide a digital output signal and memory (39) for providing said correction signal. In a specific embodiment of the invention, an improved analog-to-digital converter is disclosed including an improved digital-to-analog converter with digital correction circuitry.

17 Claims, 3 Drawing Sheets

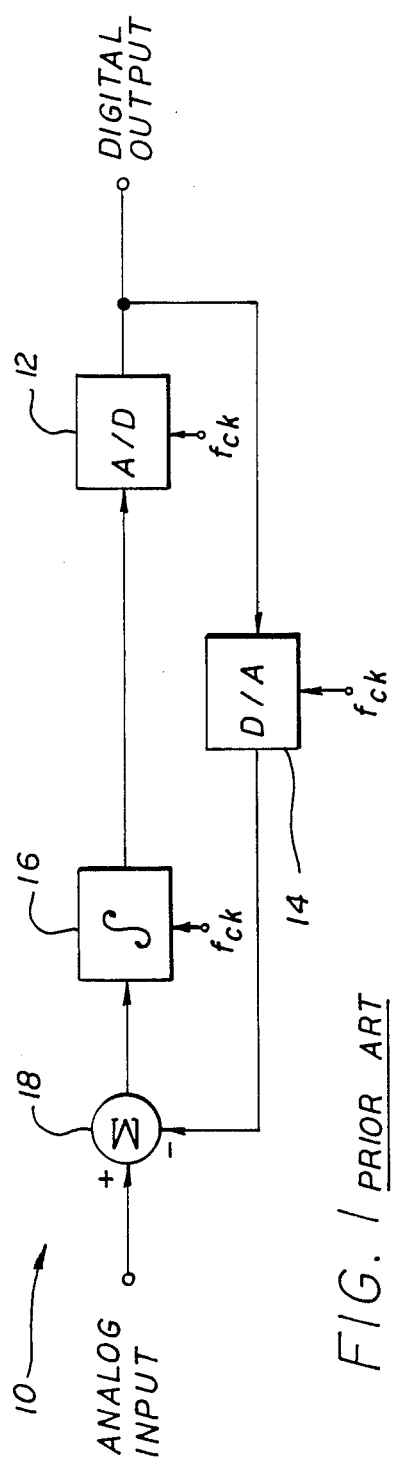
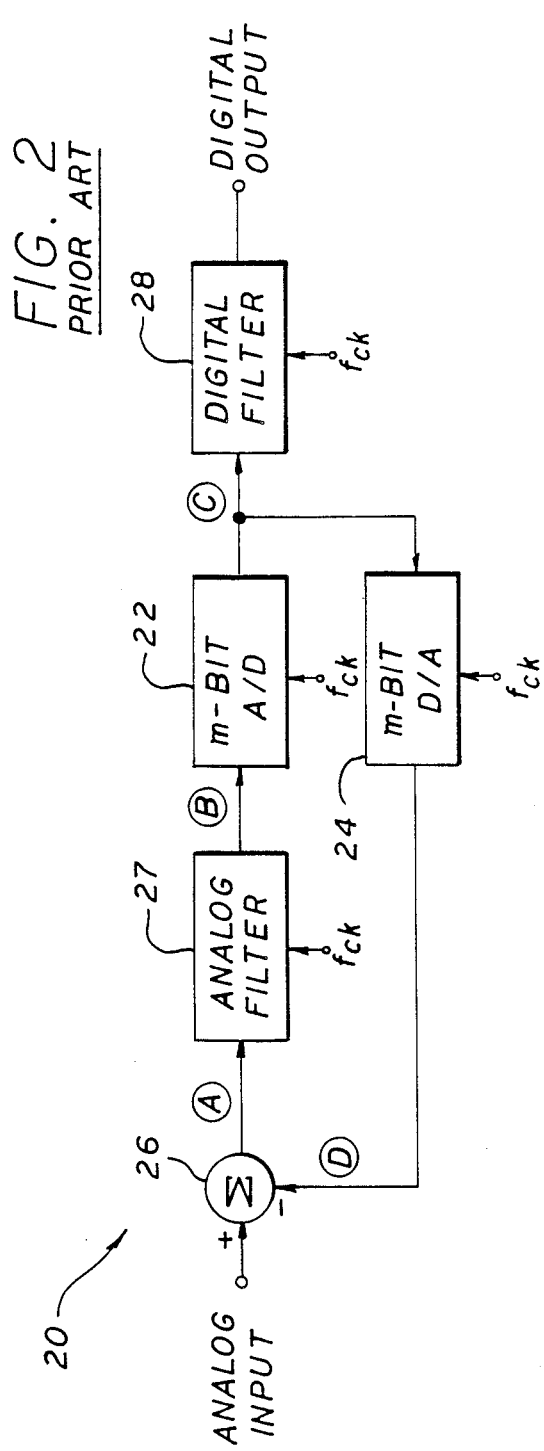
FIG. 1 PRIOR ART
FIG. 2 PRIOR ART

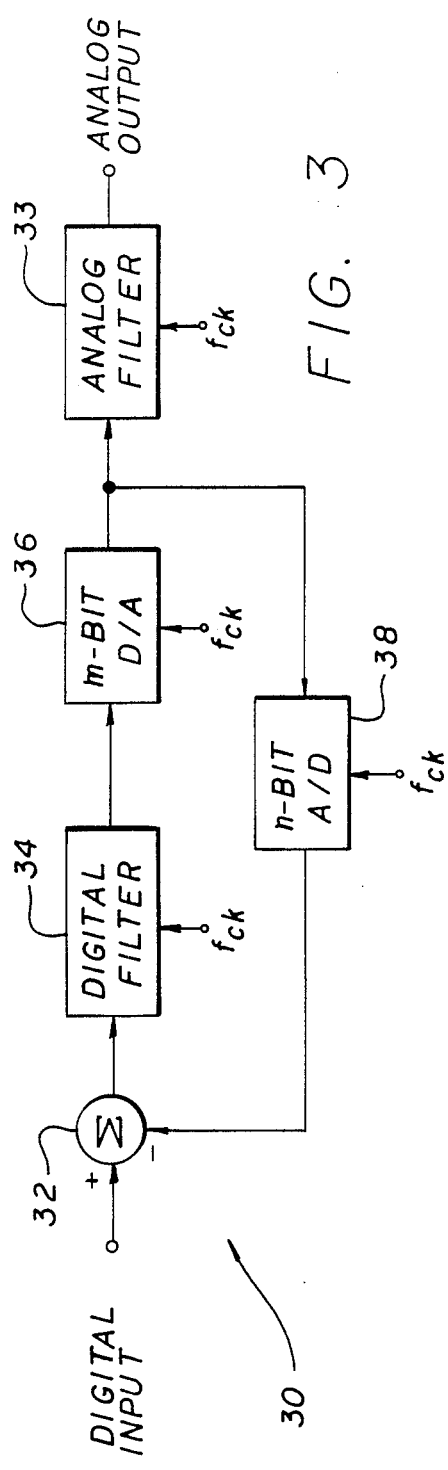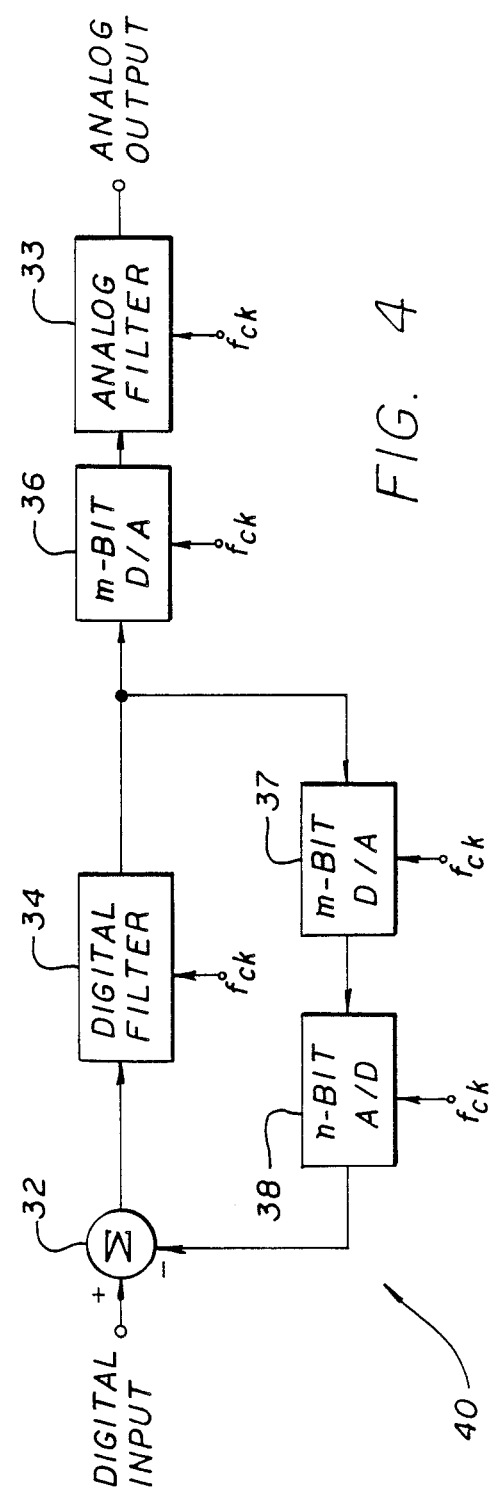

DIGITAL CORRECTION CIRCUIT FOR DATA CONVERTERS

BACKGROUND OF THE INVENTION

1. Field of the Invention

The present invention relates to analog-to-digital and digital-to-analog conversion techniques. More specifically, the present invention relates to digital correction techniques for analog-to-digital and digital-to-analog converters.

While the present invention is described herein with reference to a particular embodiment for an illustrative application, it is understood that the invention is not limited thereto. Those having ordinary skill in the art and access to the teaching provided herein will recognize additional modifications, applications and embodiments within the scope thereof.

2. Description of the Related Art

There is a continuing need to build analog-to-digital (A/D) converters and digital-to-analog (D/A) converters offering higher speed, higher resolution and lower cost. For an A/D converter, 'resolution' refers to the number of digital bits that the converter provides from an analog input, and for a D/A converter, 'resolution' refers to the number of digital bits provided to the converter for conversion to an analog signal. Typically, high resolution A/D converters require high precision non-linear circuits to accurately resolve the analog input. Providing reliable A/D converters having this high precision analog circuitry generally requires difficult and expensive manufacturing procedures. The same limitations hold for D/A converters as well. However, with current technology it has become more attractive to employ digital correction techniques rather than high precision analog circuitry for A/D and D/A converters.

One commonly used digital correction technique for providing an A/D converter with higher resolution and lower cost is typically referred to as the Sigma-Delta algorithm. This approach usually employs a low resolution A/D converter and a low resolution D/A converter in a feedback configuration to realize a high resolution A/D converter. With this feedback approach, a Sigma-Delta converter is relatively insensitive to noise generated by the low resolution A/D converter and other converter components. However, there are several problems with current Sigma-Delta implementations.

In the typical Sigma-Delta approach, the low resolution D/A converter must be as accurate as the overall conversion, because generally, the D/A converter errors propagate directly to the final output of the A/D converter. This accuracy requirement for the D/A converter often leads to production difficulties resulting in increased converter cost.

The errors induced by the low resolution D/A converter are both static and dynamic. In most cases, dynamic errors do not present as much of a problem as static errors, because typically other areas of the A/D converter limit the A/D conversion speed and thus decrease the effects of dynamic errors. It is therefore the static errors that receive considerable attention in the design of A/D converters.

Because of these static errors, most D/A converters employed in a Sigma-Delta approach are of single bit resolution. Static errors in single bit D/A converters simply create gain and offset errors in the overall A/D conversion, because the A/D converter performs a linear interpolation between the two levels of the single-bit D/A converter. Gain and offset errors do not significantly reduce the overall dynamic range of the A/D converter, since gain and offset errors simply alter the input range of the A/D converter. However, the use of single bit D/A converters reduces the resolution and speed of the A/D conversion, compared with the use of a multi-bit D/A converter.

There is therefore a need in the art for improved techniques for providing A/D and D/A converters with higher resolution at increased conversion speeds, while reducing manufacturing costs. Specifically, there is a need for an improved technique for providing a D/A converter with higher resolution for use in a Sigma-Delta A/D converter.

SUMMARY OF THE INVENTION

The need in the art is substantially addressed by the digital correction circuit of the present invention. The invention includes a subtractor 32 for subtracting a digital correction signal from an input signal, a digital filter 34 for filtering the output of the subtractor to provide a digital output signal and memory 39 for providing said correction signal. In a specific embodiment of the invention, an improved analog-to-digital converter is disclosed including an improved digital-to-analog converter with digital correction circuitry.

BRIEF DESCRIPTION OF THE DRAWINGS

FIG. 1 shows a first Sigma-Delta analog-to-digital converter proposal.

FIG. 2 shows a second configuration of the Sigma-Delta analog-to-digital converter.

FIG. 3 shows a first representation of an alternate digital-to-analog converter.

FIG. 4 shows a second representation of an alternate digital-to-analog converter.

DESCRIPTION OF THE INVENTION

Figure 5:
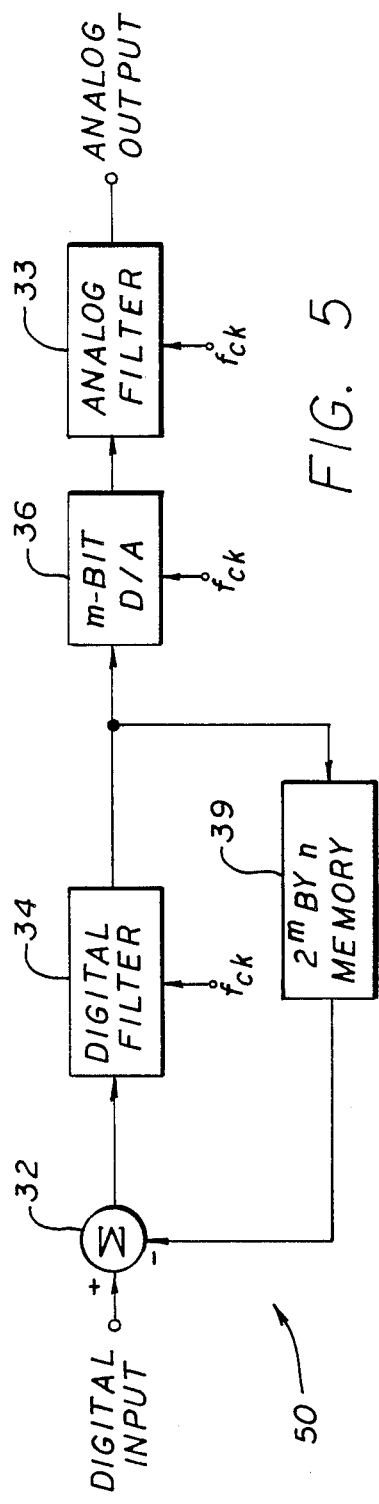
FIG. 5 shows the improved digital-to-analog converter of the present invention.

The present invention is most clearly described by first reviewing the Sigma-Delta analog-to-digital (A/D) converter of the related art. FIG. 1 shows the original proposal for a simple Sigma-Delta A/D converter 10 proposed by James C. Candy. The converter 10 includes a low resolution A/D converter 12, a low resolution digital-to-analog (D/A) converter 14 and an integrator 16 in a feedback configuration.

The converter 10 outputs a series of digital values which when averaged provides a high resolution digital representation of the analog input. Table 1 below shows the series of digital values provided by the converter 10 for an analog input having an amplitude of 8.2, assuming that the low resolution A/D converter 12 and the low resolution D/A converter 14 can resolve the data to the nearest integer value. The series of digital values output by the converter 10 repeats itself such that the average is 8.2.

TABLE 1

| Analog Input | Subtractor Output | Integrator Output | Digital Output |
|---|---|---|---|
| — | — | 8.4 | 8 |
| 8.2 | 0.2 | 8.6 | 9 |

TABLE 1-continued

| Analog Input | Subtractor Output | Integrator Output | Digital Output |
|---|---|---|---|
| 8.2 | −0.8 | 7.8 | 8 |
| 8.2 | 0.2 | 8.0 | 8 |
| 8.2 | 0.2 | 8.2 | 8 |
| 8.2 | 0.2 | 8.4 | 8 |

The converter 10 operates by producing an error signal representing the quantization error. This error is the difference output from the subtractor 18 and is input to the integrator 16 for the next cycle. A clock signal $f_{ck}$ is provided to the converters 12 and 14 and to the integrator 16 for cycle timing. The difference output of the subtractor 18 for the present cycle is provided to the integrator 16 which adds this difference to the integrator output from the previous cycle providing the sum as an output. This sum is then digitized by the A/D converter 12 to provide the digital output of the converter 10.

The digital output of the A/D converter 12 is also provided to the D/A converter 14. The D/A converter 14 provides an analog representation of the converter output as a measure of the error to the subtractor 18 for the next cycle. After the process has been repeated several times, the average of the digital outputs of the converter 10 is ideally an accurate digital representation of the analog input.

Improvements have been made to the simple Sigma-Delta A/D converter 10 of FIG. 1 resulting in the Sigma-Delta A/D converter 20 shown in FIG. 2. The converter 20 includes an m-bit A/D converter 22, an m-bit D/A converter 24 and a subtractor 26. In addition, an analog low-pass filter 27 has replaced the simple integrator 16 of the simple converter 10, resulting in increased performance for the converter 20. Also, a high order digital low-pass filter 28 was added to the output of the converter 20 to increase the resolution of the converter 20 over that available using a simple digital averager.

Those skilled in the art will recognize that the Sigma-Delta A/D converter 20 of the related art has numerous advantages over other A/D converter implementations. In particular, the converter 20 is relatively insensitive to errors generated in the path from point B to point C. Thus, the effect of the quantization error of the m-bit A/D converter 22 is effectively suppressed.

Noise generated in the path from point C to point D, through the m-bit D/A converter 24, is, however, not suppressed by the feedback of the circuit. The noise will cause errors in the D/A converter 24 which will propagate directly to the final output of the converter 20. These errors can be separated into two categories, static and dynamic. Dynamic errors (i.e. those which are time related) are generally most problematic at high conversion rates. Since other areas than the path from point C to point D of the converter 20 typically limit the conversion rate of the converter, the dynamic errors are not generally as critical. Static errors, however, can significantly limit the performance of the converter 20.

The present invention minimizes the effects of static errors and is best illustrated with initial reference to the D/A converter of FIG. 3 for the purpose of illustration. FIG. 3 shows a Sigma-Delta implementation of a D/A converter. The converter 30 includes a subtractor 32, a digital filter 34, a low resolution m-bit D/A converter 36, an analog filter 33 and a high resolution n-bit A/D converter 38. However, the A/D converter 38 has the same high accuracy requirements as the D/A converter 24 of the Sigma-Delta A/D converter 20. Thus, as is the case with the D/A converter 24, errors generated by the A/D converter 38 will not be suppressed by the feedback of the converter 30. This limits the utility of this simple Sigma-Delta approach to D/A conversion.

FIG. 4 shows a D/A converter 40, identical to the D/A converter 30 with the exception of an added m-bit D/A converter 37. Since the input to the m-bit D/A converter 37 is a low resolution digital signal and the output of the n-bit A/D converter 38 is high resolution digital output, the combination of the two can be replaced by a $2^m$ by n bit memory, thus eliminating the need for the n-bit A/D converter 38 and the added m-bit D/A converter 37 as shown in the resulting improved D/A converter 50 of the present invention in FIG. 5.

The D/A converter 50 of the present invention has a $2^m$ by n memory 39 inserted in the feedback loop from the output of the digital filter 34 to the subtractor 32. Note that the m-bit D/A converter 37 and the n-bit A/D converter 38 of FIG. 4 have been replaced by a $2^m$ by n memory 39 in the D/A converter 50 of the present invention. The $2^m$ by n memory 39 would be a standard memory i.e. ROM. The construction of the converter 50 of the present invention is otherwise the same as that of FIG. 3. The operation of the converter 50 differs from that of the converter 30 in that the memory 39 would store a lookup table which would translate the digital outputs of the filter 34 (which serve as ROM addresses) into ideal digital outputs without the errors which would otherwise be introduced by a conventional converter 38. Thus, the memory stores the transfer function of an ideal converter. Those skilled in the art will appreciate that the performance of the converter 50 can be changed by simply changing the transfer function stored in the memory 39. Further, nonlinear transfer functions may be stored which represent the performance of a number of converters. The contents of the memory 39 would be determined by computer simulation or empirically in a manner known to those skilled in the art.

Figure 6:
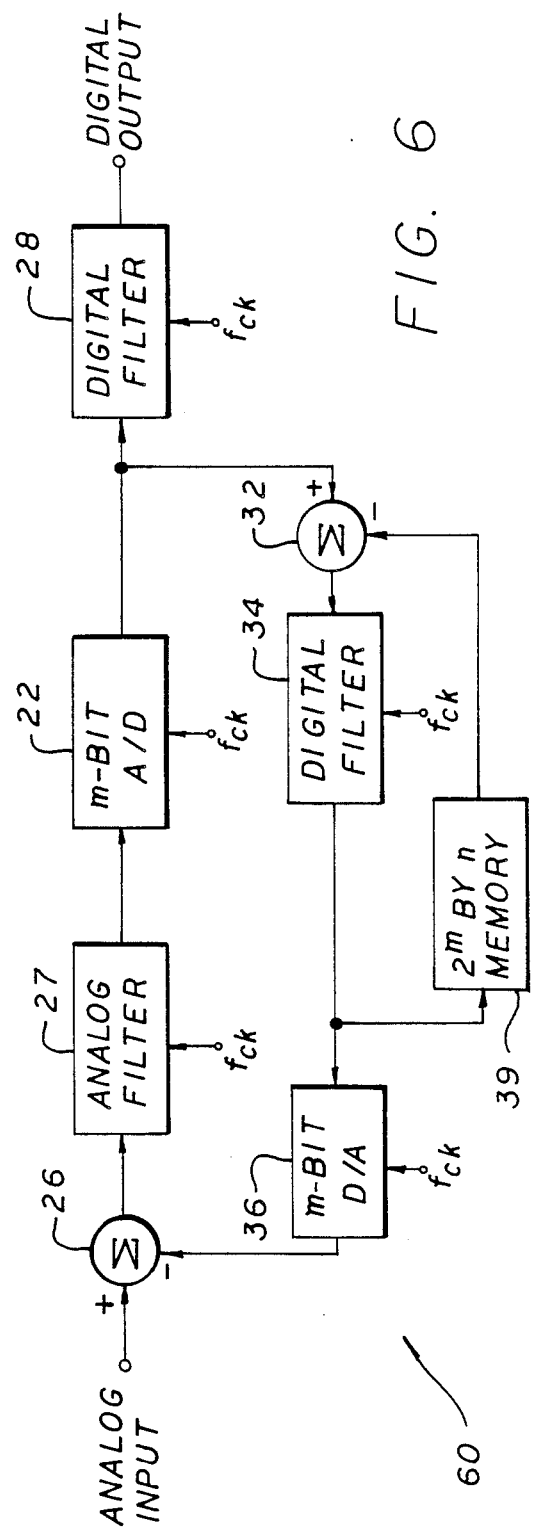
FIG. 6 shows the improved analog-to-digital converter of the present invention.

FIG. 6 shows the improved A/D converter 60 of the present invention resulting from the replacement of the m-bit D/A converter 24 with the improved D/A converter 50. FIG. 6 illustrates that the D/A converter 50 can be used alone as an electronic building block or the converter 50 can replace the m-bit D/A converter 24 in the A/D converter 20 of the related art. The improved A/D converter 60 includes a first subtractor 26, an analog filter 27, an m-bit A/D converter 22, a first digital filter 28, a second subtractor 32, a second digital filter 34, a $2^m$ by n bit memory 39 and an m-bit D/A converter 36. The converter 60 receives an analog input and provides a digital representation of the analog input as an output.

The analog input is supplied to the subtractor 26 which also receives an analog error signal from the D/A converter 36, wherein the error signal is from the previous cycle. The cycle timing is controlled by the clock $f_{ck}$. The subtractor 26 subtracts the analog error signal from the analog input to provide a difference output, wherein the difference output is a representation of the error between the analog input to the converter 60 and the digital output from the converter 60.

The difference output is supplied to the analog filter 27 which adds the difference output to the output of the analog filter 27 from the previous cycle and provides the sum as an output. The A/D converter 22 then digitizes the sum with the resulting digital signal being provided to the digital filter 28. The digital filter 28 filters the digital signal to provide the digital output from the converter 60.

The digital signal from the A/D converter 22 is also supplied to the subtractor 32. In addition, the subtractor 32 receives a digital correction signal from the memory 39. The digital correction signal is subtracted from the digital signal and provided to the digital filter 34. The digital filter 34 filters the signal with the resulting digital error signal being provided to the D/A converter 36. The D/A converter 36 converts the digital error signal into the analog error signal which is supplied to the subtractor 26.

The memory 39 also receives the digital error signal as an input. The memory 39 provides the digital correction signal for the next cycle based upon the digital error signal from the previous cycle. The digital correction signal increases the resolution of the converter 60 by providing an error signal to the subtractor 26 with higher accuracy than the error signals used in converters of the prior art.

While the present invention has been described herein with reference to an illustrative embodiment and a particular application, it is understood that the invention is not limited thereto. Those having ordinary skill in the art and access to the teachings of the present invention will recognize additional modifications and applications within the scope thereof. For example, the digital correction circuitry including the subtractor 32, the digital filter 34 and the memory 39 may be used in other applications where it is desired that a corrected digital output is provided from a digital input. In addition, the number of bits for the m-bit A/D converter 22 and the m-bit D/A converter 36 may vary without departing from the scope of the present invention. Further, the analog filter 27 and the digital filters 28 and 34 may be low pass filters or other types of filters without departing from the scope of the present invention.

It is therefore intended by the appended claims to cover any and all such modifications, applications and embodiments.

Accordingly, what is claimed is:

1. Digital correction circuitry for use in a data converter, said digital correction circuitry comprising:
   subtractor means for subtracting a digital correction signal from the digital input to said digital correction circuitry;
   digital filter means for filtering the output of said subtractor means to provide the digital output from said digital correction circuitry; and
   memory means for providing said digital correction signal.

2. The digital correction circuitry of claim 1 wherein said memory means is a lookup table with a stored converter transfer function.

3. The digital correction circuitry of claim 2 wherein said lookup table receives said digital output as an address input and provides said digital correction signal as an output.

4. The digital correction circuitry of claim 1 wherein said digital filter is a low pass filter.

5. An improved digital-to-analog converter comprising:
   subtractor means for subtracting a digital correction signal from the digital input to said improved digital-to-analog converter;
   digital filter means for filtering the output of said subtractor means to provide a filtered digital signal;
   analog converter means for converting said filtered digital signal to an analog signal for output by the improved digital-to-analog converter; and
   memory means for providing said digital correction signal from said filtered digital signal.

6. The improved digital-to-analog converter of claim 5 wherein said memory means is a lookup table with a stored converter transfer function.

7. The improved digital-to-analog converter of claim 6 wherein said lookup table receives said filtered digital signal as an address input and provides said digital correction signal as an output.

8. The improved digital-to-analog converter of claim 5 wherein said digital filter means is a low pass filter.

9. The improved digital-to-analog converter of claim 5 wherein said analog converter means includes analog filter means for filtering said analog signal.

10. The improved digital-to-analog converter of claim 9 wherein said analog filter means is a low pass filter.

11. An improved analog-to-digital converter comprising:
    first subtractor means for subtracting an analog error signal from the analog input to said improved analog-to-digital converter;
    analog filter means for filtering the output of said first subtractor means;
    digital converter means for converting the output of said analog filter into a digital signal;
    first digital filter means for filtering said digital signal to provide a filtered digital signal as the output of the improved analog-to-digital converter; and
    an improved digital-to-analog converter which receives said digital signal as an input and provides said analog error signal as an output.

12. The improved analog-to-digital converter of claim 11 wherein said improved digital-to-analog converter includes subtractor means for subtracting a digital correction signal from said digital signal, second digital filter means for filtering the output of said subtractor means to provide a digital error signal, analog converter means for converting said digital error signal to an analog error signal for output by the improved digital-to-analog converter and memory means for providing said digital correction signal from said digital error signal.

13. The improved analog-to-digital converter of claim 12 wherein said memory means is a lookup table with a stored converter transfer function.

14. The improved analog-to-digital converter of claim 13 wherein said lookup table receives said digital error signal as an address input and provides said digital correction signal as an output.

15. The improved analog-to-digital converter of claim 12 wherein said second digital filter means is a low pass filter.

16. The improved analog-to-digital converter of claim 11 wherein said first digital filter means is a low pass filter.

17. The improved analog-to-digital converter of claim 11 wherein said analog filter means is a low pass filter.

* * * * *